US009620238B2

(12) United States Patent
Khandelwal et al.

(10) Patent No.: US 9,620,238 B2
(45) Date of Patent: Apr. 11, 2017

(54) METHODS AND SYSTEMS THAT SELECTIVELY INHIBIT AND ENABLE PROGRAMMING OF NON-VOLATILE STORAGE ELEMENTS

(71) Applicant: SanDisk Technologies Inc., Plano, TX (US)

(72) Inventors: Anubhav Khandelwal, San Jose, CA (US); Dana Lee, Saratoga, CA (US); Henry Chin, Milpitas, CA (US); LanLan Gu, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/493,039

(22) Filed: Sep. 22, 2014

(65) Prior Publication Data

US 2015/0206593 A1 Jul. 23, 2015

Related U.S. Application Data

(60) Provisional application No. 61/929,455, filed on Jan. 20, 2014.

(51) Int. Cl.
*G11C 11/34* (2006.01)
*G11C 16/34* (2006.01)
*G11C 11/56* (2006.01)

(52) U.S. Cl.
CPC ...... *G11C 16/3459* (2013.01); *G11C 11/5628* (2013.01)

(58) Field of Classification Search
USPC ............ 365/185.03, 185.09, 185.11, 185.17, 365/185.18, 185.19, 185.21, 185.22,
(Continued)

(56) References Cited

U.S. PATENT DOCUMENTS 7,073,103 B2 7/2006 Gongwer et al.
7,301,817 B2 11/2007 Li et al.
(Continued)

*Primary Examiner* — Trong Phan
(74) *Attorney, Agent, or Firm* — Vierra Magen Marcus LLP

(57) ABSTRACT

Non-volatile storage systems, and methods for programming non-volatile storage elements of non-volatile storage systems, are described herein. A method for programming a non-volatile storage element, wherein a loop number is incremented with each program-verify iteration includes performing a plurality of program-verify iterations for the non-volatile storage element. This includes inhibiting programming of the non-volatile storage element when the loop number is less than a loop number threshold corresponding to a target data state that the storage element is being programmed to. This also includes enabling programming of the non-volatile storage element when the the loop number is greater than or equal to the loop number threshold corresponding to the target data state that the storage element is being programmed to. Inhibiting programming of the non-volatile storage element causes boosting of a channel voltage of the storage element, which speeds up programming of one or more further non-volatile storage elements neighboring the boosted storage element, compared to if there were no such boosting.

23 Claims, 12 Drawing Sheets

(58) Field of Classification Search
USPC .......................... 365/185.24, 185.29, 185.33
See application file for complete search history.

(56) References Cited

U.S. PATENT DOCUMENTS

| | | |
|---|---|---|
| 7,447,086 B2 | 11/2008 | Wan et al. |
| 7,619,930 B2 | 11/2009 | Mokhlesi |
| 7,688,638 B2 | 3/2010 | Hemink |
| 7,995,394 B2 * | 8/2011 | Dong ................ G11C 16/0483 365/185.03 |
| 8,107,298 B2 * | 1/2012 | Mui ................... G11C 11/5628 365/185.22 |
| 8,174,895 B2 | 5/2012 | Chen et al. |
| 8,218,366 B2 * | 7/2012 | Dong ................ G11C 11/5628 365/185.22 |
| 8,320,177 B2 | 11/2012 | Dutta et al. |
| 8,369,149 B2 | 2/2013 | Dutta et al. |
| 8,385,132 B2 * | 2/2013 | Dutta .................... G11C 16/24 365/185.19 |
| 8,395,936 B2 * | 3/2013 | Li ...................... G11C 16/0483 365/185.22 |
| 8,873,293 B1 * | 10/2014 | Ou ........................ G11C 16/16 365/185.17 |
| 8,902,659 B2 * | 12/2014 | Chan ....................... G11C 7/12 365/185.17 |
| 8,902,668 B1 * | 12/2014 | Dutta ................ G11C 16/3459 365/185.22 |
| 8,929,142 B2 * | 1/2015 | Dong ................ G11C 16/3427 365/185.17 |
| 8,988,939 B2 * | 3/2015 | Dunga ................... G11C 16/12 365/185.22 |
| 8,988,942 B2 * | 3/2015 | Sharon ............... G11C 11/5628 365/185.17 |
| 9,047,970 B2 * | 6/2015 | Wan ................... G11C 11/5642 |
| 9,099,202 B2 * | 8/2015 | Mihnea ............... G11C 11/5671 |
| 9,135,989 B2 * | 9/2015 | Sakai ................. G11C 11/5628 |
| 9,230,663 B1 * | 1/2016 | Lu ...................... G11C 11/5628 |

\* cited by examiner

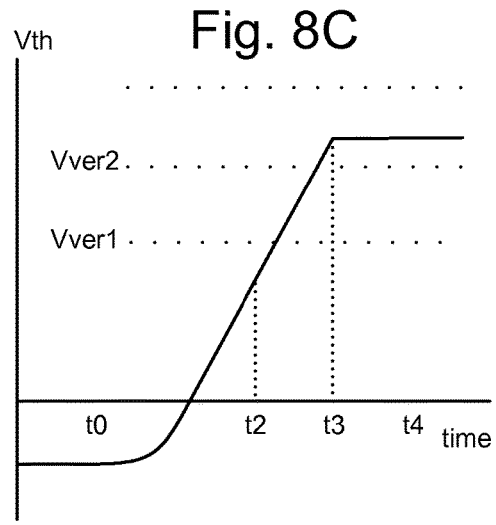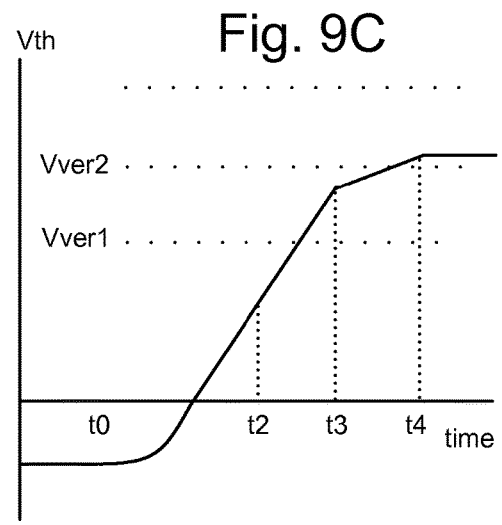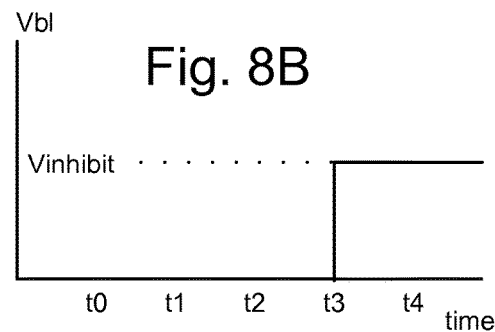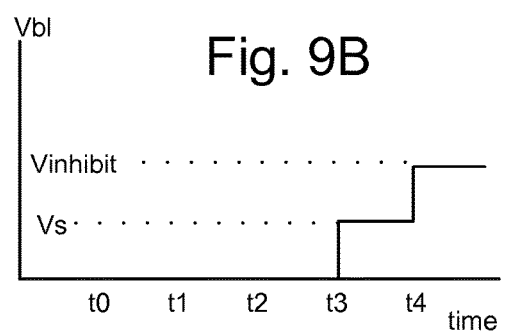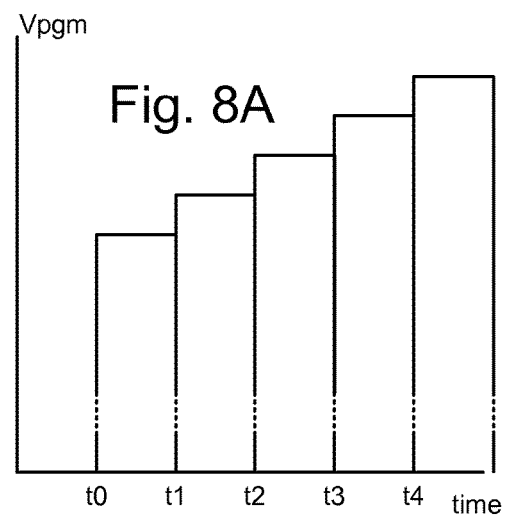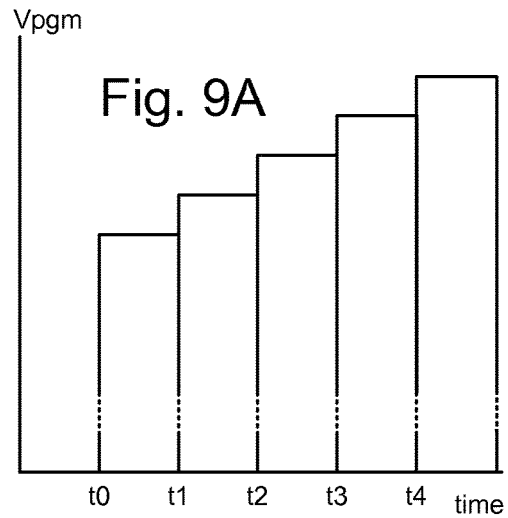

METHODS AND SYSTEMS THAT SELECTIVELY INHIBIT AND ENABLE PROGRAMMING OF NON-VOLATILE STORAGE ELEMENTS

PRIORITY CLAIMS

The present application claims priority to U.S. Provisional Patent Application No. 61/929,455, filed Jan. 20, 2014, which is incorporated herein by reference.

FIELD

The embodiments described herein relate to technology for non-volatile storage.

DESCRIPTION OF THE RELATED ART

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Pat. No. 7,237,074, both of which are incorporated herein by reference in their entirety, describe various data encoding schemes for multi-state flash memory cells.

In some embodiments, the program voltage applied to the control gate includes a series of pulses that are increased in magnitude with each successive pulse by a predetermined step size (e.g. 0.2 v, 0.3 v, 0.4 v, or others). Between pulses, the memory system will verify whether the individual memory cells have reached their respective target threshold voltage ranges. Those memory cells that have reached their target threshold voltage range will be locked out of future programming (e.g., by raising the bit line voltage to VDD). When all memory cells have reached their target threshold voltage range, programming is complete.

With multi-state non-volatile storage, some systems will verify memory cells being programmed to each allowed threshold voltage range between programming pulses. The more allowed threshold voltage ranges, the longer it takes to perform the verification. Longer verification operations slow down the programming process.

One known way to speed up the programming of the non-volatile storage elements is to selectively skip performing the verify process (which involves applying one or more verify pulses) on non-volatile storage elements that probabilistically are below their verify target levels. Conventionally, during a program-verify iteration that skips performing the verify process on a particular non-volatile storage element (e.g., because the target data state for the non-volatile storage element is one of the higher data states), programming of that particular non-volatile storage element is enabled during early program-verify iterations.

SUMMARY

Embodiments described herein generally relate to non-volatile storage and related methods. In accordance with an embodiment, a non-voltage storage system includes a non-volatile storage element and a control circuit in communication with the non-volatile storage element, wherein the control circuit is configured to selectively inhibit or enable programming of the non-volatile storage element based on a comparison between a program-verify iteration and a threshold that corresponds to a target data state for the non-volatile storage element. When the control circuit inhibits programming of the non-volatile storage element, a channel voltage of the non-volatile storage element is boosted, which may speed up programming of one or more further non-volatile storage elements neighboring the non-volatile storage element, compared to if the channel voltage of the non-volatile storage element is not boosted. This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 8A, B and C depict one embodiment of a coarse/fine programming scheme.

FIGS. 9A, B and C depict one embodiment of a coarse/fine programming scheme.

DETAILED DESCRIPTION

Non-volatile storage systems, and methods for programming non-volatile storage elements of non-volatile storage systems, are described herein. During programming of a non-volatile storage element, a plurality of program-verify iterations are performed. In specific embodiments described herein, this includes inhibiting programming of the non-volatile storage element when a present program-verify iteration is less than a threshold that corresponds to a target data state that the storage element is being programmed to, and enabling programming of the non-volatile storage element when the present program-verify iteration is greater than or equal to the threshold that corresponds to the target data state that the storage element is being programmed to. The aforementioned inhibiting programming of the non-volatile storage element causes boosting of a channel voltage of the storage element, which speeds up programming of one or more further non-volatile storage elements neighboring the boosted storage element, compared to if there were no such boosting. Such embodiments can improve reliability, provide for tighter threshold voltage distributions, and/or cause neighboring non-volatile storage elements to program faster due to an increased channel to neighbor floating gate coupling. Such embodiments can also reduce program disturbs and/or Vpass disturbs, as will be described in additional detail below.

Figure 1:
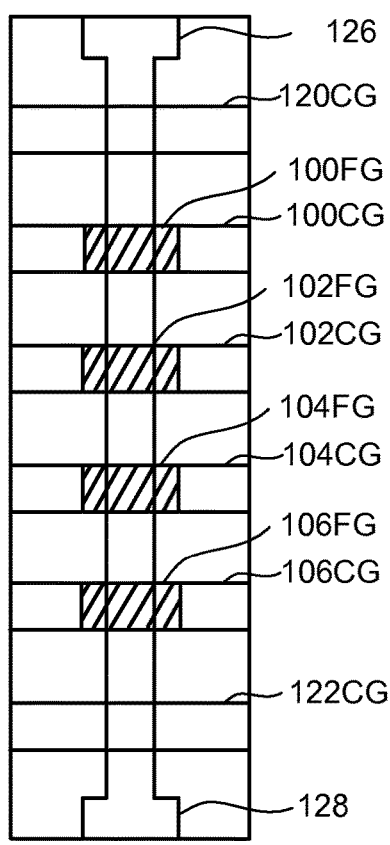
FIG. 1 is a top view of a NAND string.
Figure 2:
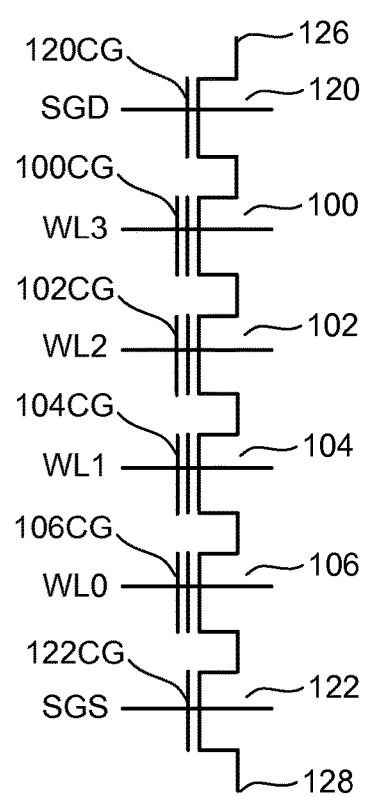
FIG. 2 is an equivalent circuit diagram of the NAND string.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Transistor 120 includes a control gate 120CG. Transistor 122 includes a control gate 122CG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Other types of non-volatile storage devices, in addition to NAND flash memory, can also be used to implement the new technology described herein. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

Figure 3:
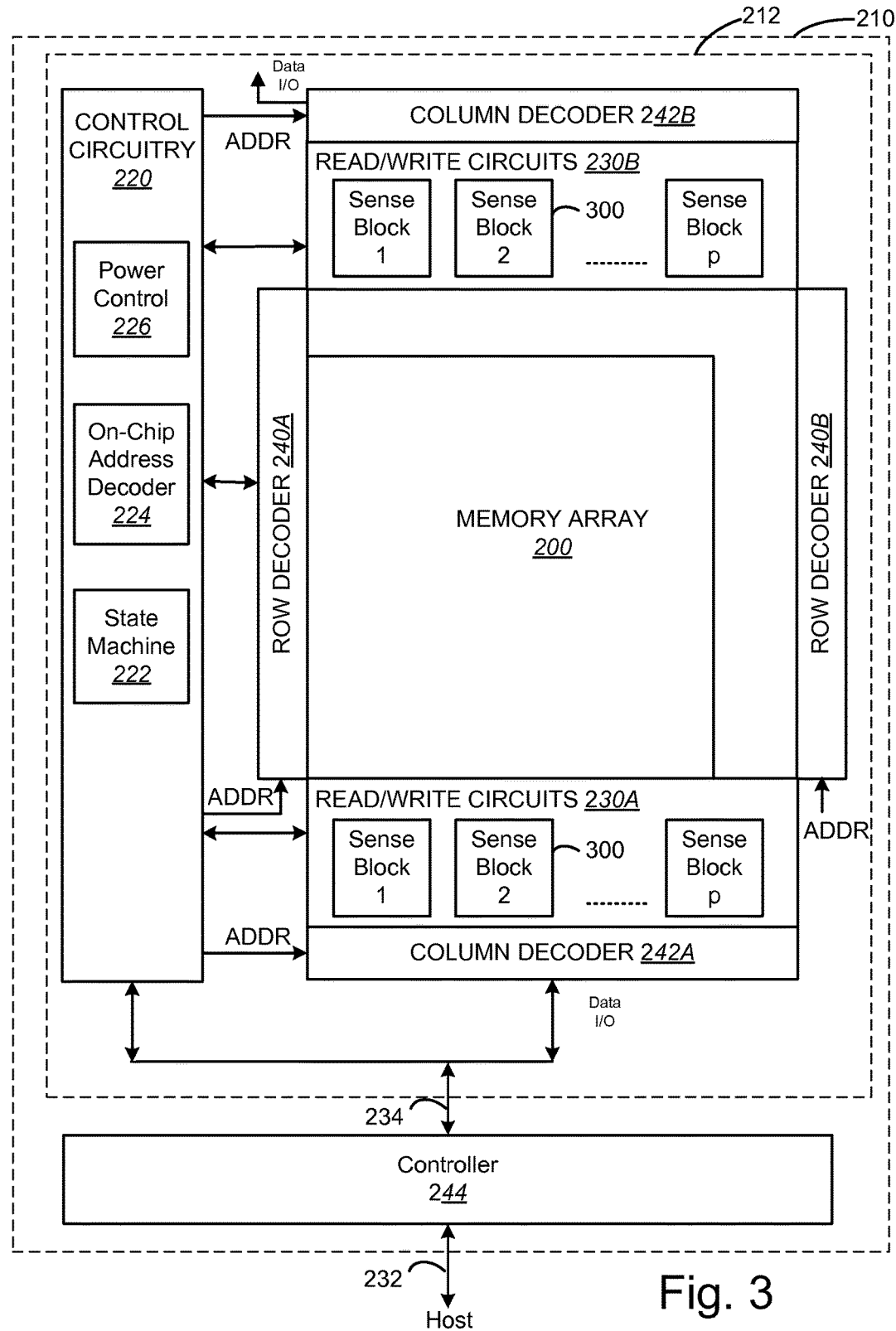
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three-dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 (e.g., sense block 1, sense block 2 . . . sense block p) which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. Exemplary buses for transferring addresses are labeled ADDR, and exemplary bussed for transferring commands and data are labeled Data I/O.

The memory device may comprise one or more array of memory cells including a three-dimensional (3D) array. The memory device may comprise a monolithic three dimensional memory array in which multiple memory levels are formed above (and not in) a single substrate, such as a wafer, with no intervening substrates. The memory device may comprise any type of non-volatile memory that is monolithically formed in one or more physical levels of arrays of memory cells having an active area disposed above a silicon substrate. The memory device may be in a non-volatile memory device having circuitry associated with the operation of the memory cells, whether the associated circuitry is above or within the substrate.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array. By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration. Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the controller 244, collectively or separately, can be referred to as a control circuit.

Figure 4:
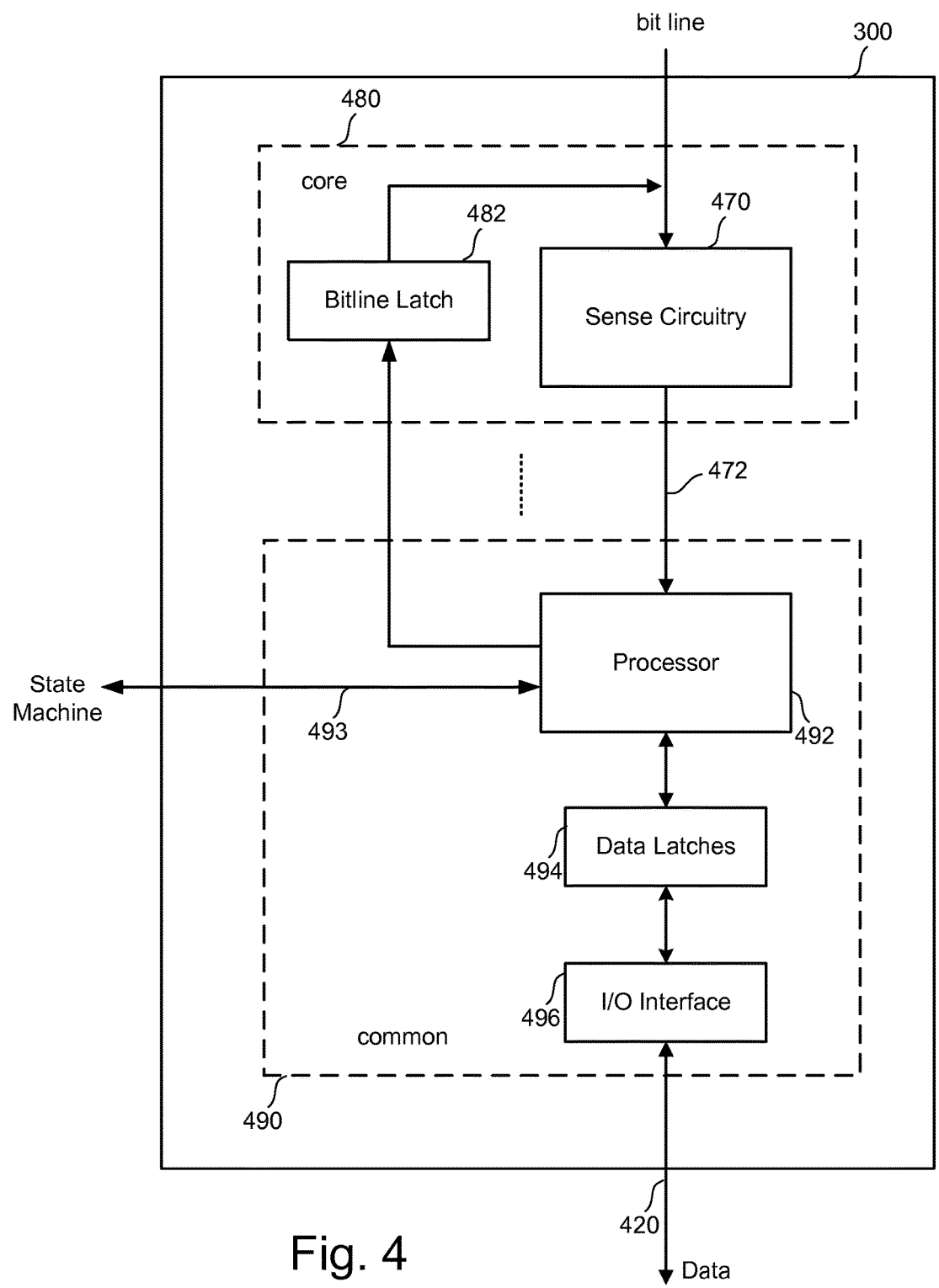
FIG. 4 is a block diagram depicting one embodiment of a sense block.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., VDD).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in come embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells so that memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 5A:
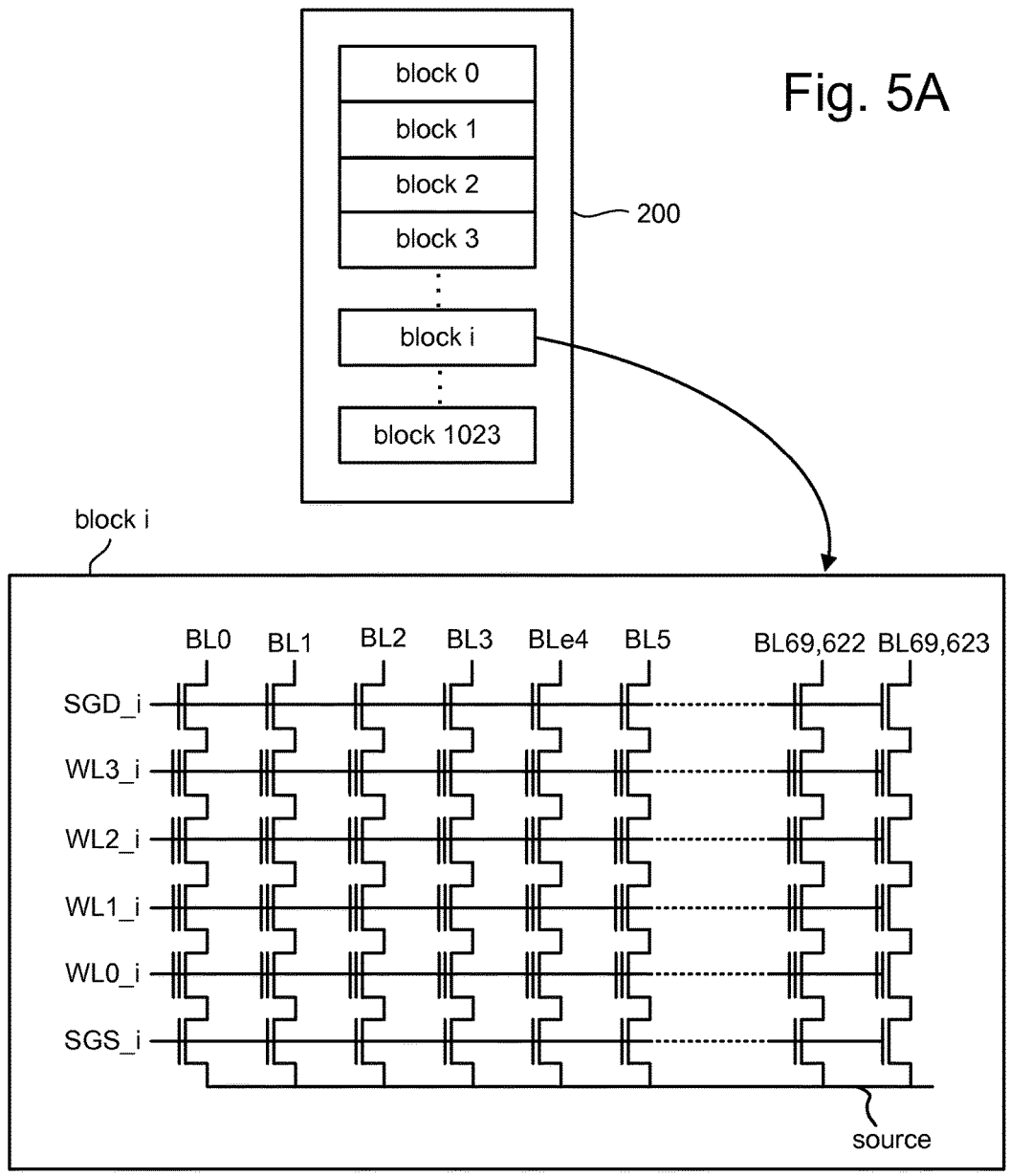
FIG. 5A is a block diagram depicting one embodiment of a memory array.

FIG. 5A depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together.

As one example, a NAND flash EEPROM is depicted in FIG. 5A that is partitioned into 1,024 blocks, labeled block 0, block 1, block 2, . . . block i, . . . block 1023. However, more or less than 1024 blocks can be used. In each block, in this example, there are 69,624 columns corresponding to bit lines BL0, BL1, . . . BL69,623. In one embodiment, all the bit lines of a block can be simultaneously selected during read and program operations. Memory cells along a common word line and connected to any bit line can be programmed (or read) at the same time. In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5A shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS). Exemplary select gate source lines, for block_i, are labeled SGS_i. Exemplary word lines, for block_i, are labeled WL0_i, WL1_i, WL2_i and WL3_i.

Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associate with other numbers of pages.

Figure 5B:
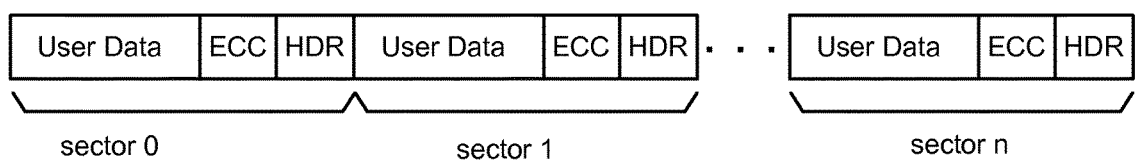
FIG. 5B depicts a page of data.

FIG. 5B depicts data for a page. Depending on the size of the page, the page contains many sectors. Each sector includes user data, error correction codes (ECC), and header information. Exemplary sectors, labeled sector 0, sector 1 . . . sector n, are shown in FIG. 5B.

In some memory systems utilizing multi-state memory cells, each bit of data in a memory cell is in a different page. For example, if an array of memory cells store three bits of data (eight states or levels of data) per memory cell, each memory cell stores data in three pages with each of the three bits being on a different page. Thus, within a block in this example, each word line is associated with three pages or an integer multiple of three pages. Other arrangements are also possible.

The use of error correction coding (ECC) in mass data storage devices and storage systems, as well as in data communications systems, is well known. As fundamental in this art, error correction coding involves the storage or communication of additional bits (commonly referred to as parity bits, code bits, checksum digits, ECC bits, etc.) that are determined or calculated from the "payload" (or original data) data bits being encoded. For example, the storage of error correction coded data in a memory resource involves the encoding of one or more code words to include the actual data and the additional code bits, using a selected code. Retrieval of the stored data involves the decoding of the stored code words according to the same code as used to encode the stored code words. Because the code bits "over-specify" the actual data portion of the code words, some number of error bits can be tolerated, without any loss of actual data evident after decoding.

Many ECC coding schemes are well known in the art. These conventional error correction codes are especially useful in large scale memories, including flash (and other non-volatile) memories, because of the substantial impact on manufacturing yield and device reliability that such coding schemes can provide, allowing devices that have a few non-programmable or defective cells to be useable. Of course, a tradeoff exists between the yield savings and the cost of providing additional memory cells to store the code bits (i.e., the code "rate"). Some ECC codes for flash memory devices tend to have higher code rates (i.e., a lower ratio of code bits to data bits) than the codes used in data communications applications (which may have code rates as low as ½).

Some memory cells are slower to program or erase than others because of manufacturing variations among those cells, because those cells were previously erased to a lower threshold voltage than others, because of uneven wear among the cells within a page, or other reasons. And, of course, some cells cannot be programmed or erased whatsoever, because of a defect or other reason. Additionally, some memory cells program fast and can be over programmed, which may also cause an error. As mentioned above, error correction coding provides the capability of tolerating some number of failed cells, while still maintaining the memory as usable. In some applications, a page of data is programmed by repeatedly applying programming pulses until all memory cells on that page verify to the desired programmed state. In some implementation, programming and erasing time is saved by terminating the sequence of programming or erasing pulses when the number of error memory cells that are not yet fully programmed or erased is fewer than the number of bits that are correctable.

Error correction is typically performed on a sector-by-sector basis. Thus, each sector will have its own set of ECC codes. This error correction is convenient and useful because, in one embodiment, the sector is the desired unit of data transfer to and from the host system.

Figure 6A:
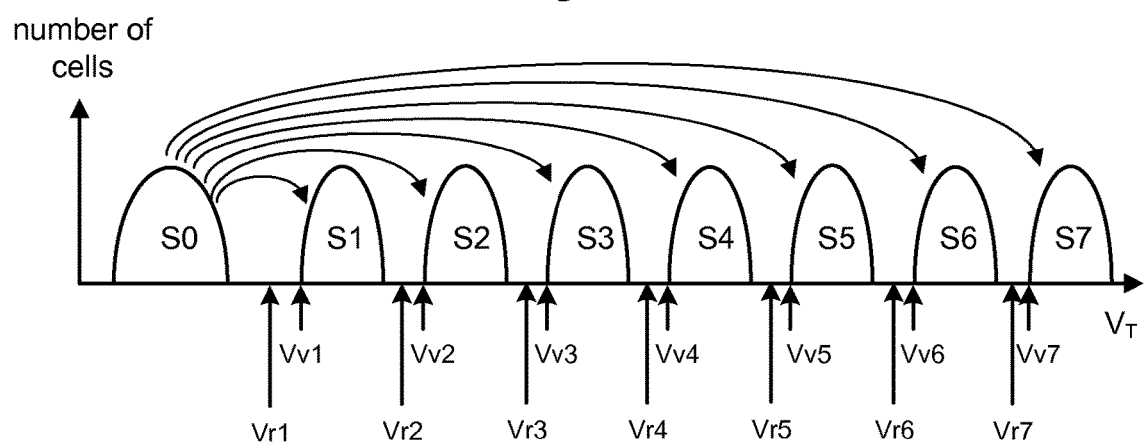
FIG. 6A depicts an example set of threshold voltage distributions and describes a process for programming non-volatile memory.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example threshold voltage distributions for the memory cell array when each memory cell stores three bits of data. Other embodiments, however, may use more or less than three bits of data per memory cell (e.g., such as three bits of data per memory cell).

In the example of FIG. 6A, each memory cell stores three bits of data; therefore, there are eight valid threshold voltage (VT) distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Pat. No. 7,237,074, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 6A.

FIG. 6A shows a set of verify target levels Vv1, Vv2, Vv3, Vv4, Vv5, Vv6, and Vv7. These verify levels are used as comparison levels during the programming process. For example, when programming memory cells to state S1, the system will check to see if the threshold voltages of the memory cells has reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 6A also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine which states that memory cells are storing data for.

In general, during verify operations and read operations, the selected word line is connected to a voltage, a level of which is specified for each read operation (e.g., see read compare levels Vr1, Vr2, Vr3, Vr4, Vr5, Vr6, and Vr7, of FIG. 6A) or verify operation (e.g. see verify target levels Vv1, Vv2, Vv3, Vv4, Vv5, Vv6, and Vv7 of FIG. 6A) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The read and verify operations described above can be performed according to techniques known in the art. also be used.

Figure 6B:
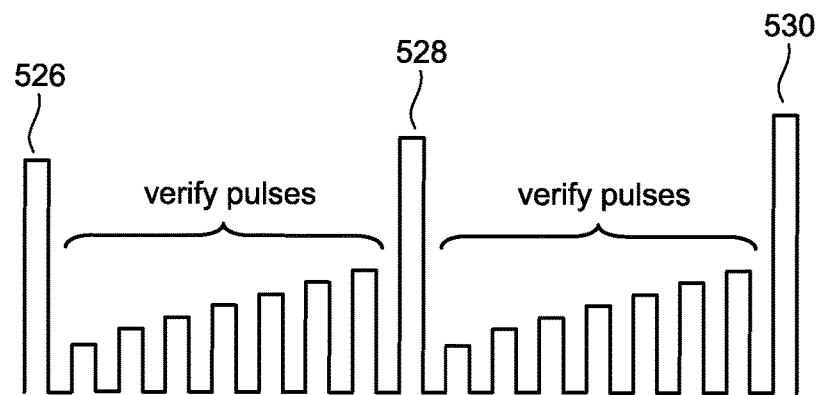
FIG. 6B depicts three programming pulses, and the verify pulses applied between the programming pulses.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 6B shows a portion of a signal applied to the control gates of a plurality of memory cells connected to a common word line. FIG. 6B shows programming pulses 526, 528 and 530, with a set of verify pulses between the programming pulses. When performing full sequence programming in one embodiment, the verification process (also referred to as the verify process) between programming pulses will test for each of the threshold voltage distribution (data states) S1-S7. Therefore, FIG. 6B shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 6A have reached Vv2, there is no reason to verify at Vv7. More information about intelligent verification schemes that skip verification for one or more states can be found in the following patent documents which are incorporated herein by reference in their entirety, and are discussed in some additional detail below: U.S. Pat. No. 7,073,103; and U.S. Pat. No. 7,688,638.

Figure 7A:
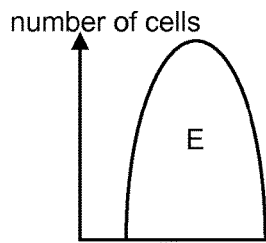
FIGS. 7A-E show various threshold voltage distributions and describe a process for programming non-volatile memory.
Figure 7B:
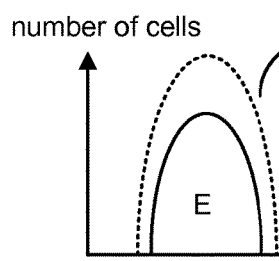

FIG. 6A shows a programming process that includes one phase where all memory cells connected to the same word line are programmed concurrently during that one phase. FIG. 7 illustrates a multi-phase programming approach. In this embodiment, the programming process includes three phases. Prior to programming, the memory cells are erased so that all memory cells connected to a common word line are in an erased threshold voltage distribution E, as depicted in FIG. 7A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 7B. Memory cells being programmed to intermediate state IM are programmed to a target threshold voltage of VvIM.

Figure 7C:
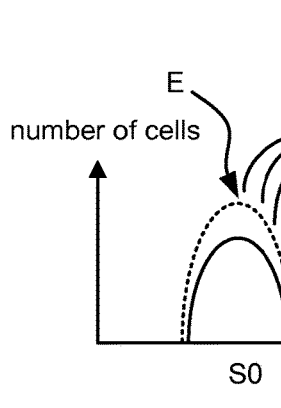
Figure 7D:
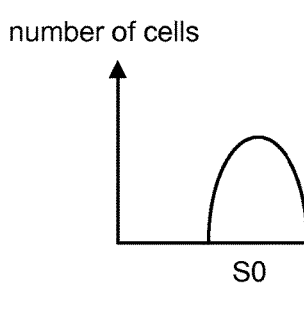
Figure 7E:
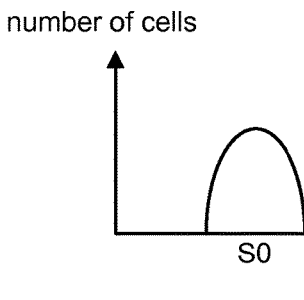

During the second phase of the programming process of FIGS. 7A-E, those memory cells that are in the erased threshold voltage ($V_T$) distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 7C.

As can be seen in FIG. 7C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. Exemplary intermediate verify targets Vv1', Vv2', Vv3', Vv4', Vv5', Vv6' and Vv7' are shown in FIG. 7C.

In the third phase of programming, each of data states S1-S7 are tightened so that they no longer overlap with neighboring states. This is depicted graphically by FIG. 7D. The final result of the three phrase programming process is depicted in step 7E, which shows data states S0-S7. In some embodiments, data state S0 is wider than data states S1-S7.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

In some programming processes, coarse/fine programming techniques can be incorporated. For example, memory cells being programmed to a target condition (e.g., Vv2) would first be quickly programmed to coarse condition (e.g., Vv2 less a small voltage) that corresponds to a threshold voltage condition slightly lower than the target condition. Subsequently, the memory cells would be programmed to the target condition in a manner more slowly (and with more precision).

FIGS. 8A-C and 8A-C provide more detail of one example of a coarse/fine programming technique. FIGS. 8A and 9A depict the programming pulses Vpgm applied to the control gate. FIGS. 8B and 9B depict the bit line voltages for the memory cells being programmed. FIGS. 8C and 9C depict the threshold voltage of the memory cells being programmed. This example uses two verify levels, indicated in the Figures as Vver1 and Vver2. The final target level (e.g., verify levels Vv1, Vv2, Vv3, Vv4, Vv5, Vv6, and Vv7 of FIG. 6A) is Vver1. When a threshold voltage of the memory cell has reached Vver1, the memory cell will be inhibited from further programming by applying an inhibit voltage to the bit line corresponding to that memory cell. For example, the bit line voltage can be raised to Vinhibit (See FIG. 8B and FIG. 9B). In one embodiment, Vinhibit is Vdd. However, when a memory cell has reached a threshold voltage close to (but lower than) the target value Vver1, the threshold voltage shift to the memory cell during subsequent programming pulses is slowed down by applying a certain bias voltage to the bit line, typically in the order of 0.3 v to 0.8 v. Because the rate of threshold voltage shift is reduced during the next few programming pulses, the final threshold voltage distribution can be narrower than otherwise. To implement this method, a second verify level that is lower than that of Vver1 is used. This second verify level is depicted as Vver2. When the threshold voltage of the memory cell is larger than Vver2, but still lower than Vver1, the threshold voltage shift to the memory cell will be reduced for subsequent programming pulses by applying a bit line bias Vs (FIG. 9B). Note that in this case, two verify operations are required for each state. One verify operation at the corresponding Vver1 for each state, and one verify operation at the corresponding Vver2 for each state. This may increase the total time needed to program the memory cells. However, a larger ΔVpgm step size can be used to speed up the process.

FIGS. 8A, 8B, and 8C show the behavior of a memory cell whose threshold voltage (Vth) moves past Vver2 and Vver1 in one programming pulse. For example, the threshold voltage is depicted in FIG. 8C to pass Vver2 and Vver1 in between t2 and t3. Thus, prior to t3 (e.g., at times t0, t1 and t2), the memory cell is in the coarse phase. After t3 (e.g., at time t4), the memory cell is in the inhibit mode.

FIGS. 9A, 9B, and 9C depict a memory cell that enters both the coarse and fine programming phases. The threshold voltage (Vth) of the memory cell crosses Vver2 in between time t2 and time t3. Prior to t3 (e.g., at times t0, t1 and t2), the memory cell is in the coarse phase. After t3, the bit line voltage (Vb1) is raised to Vs; therefore, the memory cell is in the fine phase. In between t3 and t4, the threshold voltage (Vth) of the memory cell crosses Vver1; therefore, the memory cell is inhibited from further programming by raising the bit line voltage to Vinhibit.

In one embodiment, the coarse/fine programming technique is used for the third phase of the multi-phase programming process of FIGS. 7A-7E, but not for the first two phases. In other embodiments, the coarse/fine programming technique is used for all phases. The coarse/fine programming technique can also be used for full sequence programming.

Figure 10:
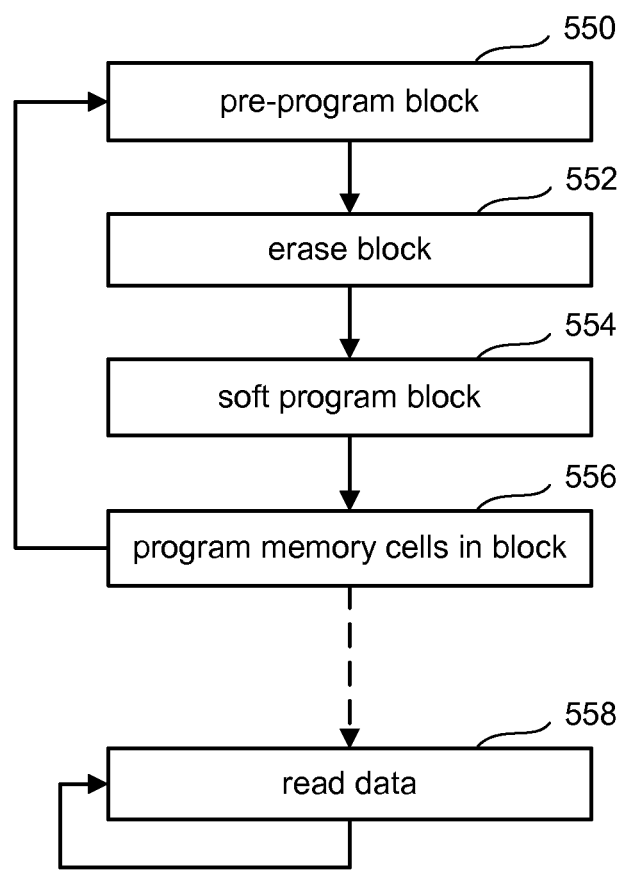
FIG. 10 is a flow chart describing one embodiment of a process for operating non-volatile memory.

FIG. 10 is a flow chart describing a process for operating a non-volatile storage system. In one embodiment, the process of FIG. 10 is used to program a block of memory cells. In one implementation of the process of FIG. 10, memory cells are pre-programmed in order to maintain even wear on the memory cells (step 550). In one embodiment, the memory cells are preprogrammed to the highest data state, a random pattern, or any other pattern. In some implementations, pre-programming need not be performed.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells will be in state S0. One implementation of an erase process includes applying several erase pulses to the p-well and verifying between erase pulses whether the NAND strings are properly erased.

At step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution (e.g., S0).

In step 556, the memory cells of the block are programmed. The programming can be performed in response to a request to program from the host, or in response to an internal process. After programming, the memory cells of the block can be read (step 558). Many different read processes known in the art can be used to read data. In some embodiments, the read process includes using ECC to correct errors. The data that is read is output to the hosts that requested the read operation. The ECC process can be performed by the state machine, the controller or another device.

FIG. 10 shows that the erase-program cycle can happen many times without or independent of reading, the read process can occur many times without or independent of programming, and the read process can happen any time after programming. The process of FIG. 10 can be performed at the direction of the state machine using the various circuits described above. In other embodiments, the process of FIG. 10 can be performed at the direction of the controller using the various circuits described above.

Figure 11:
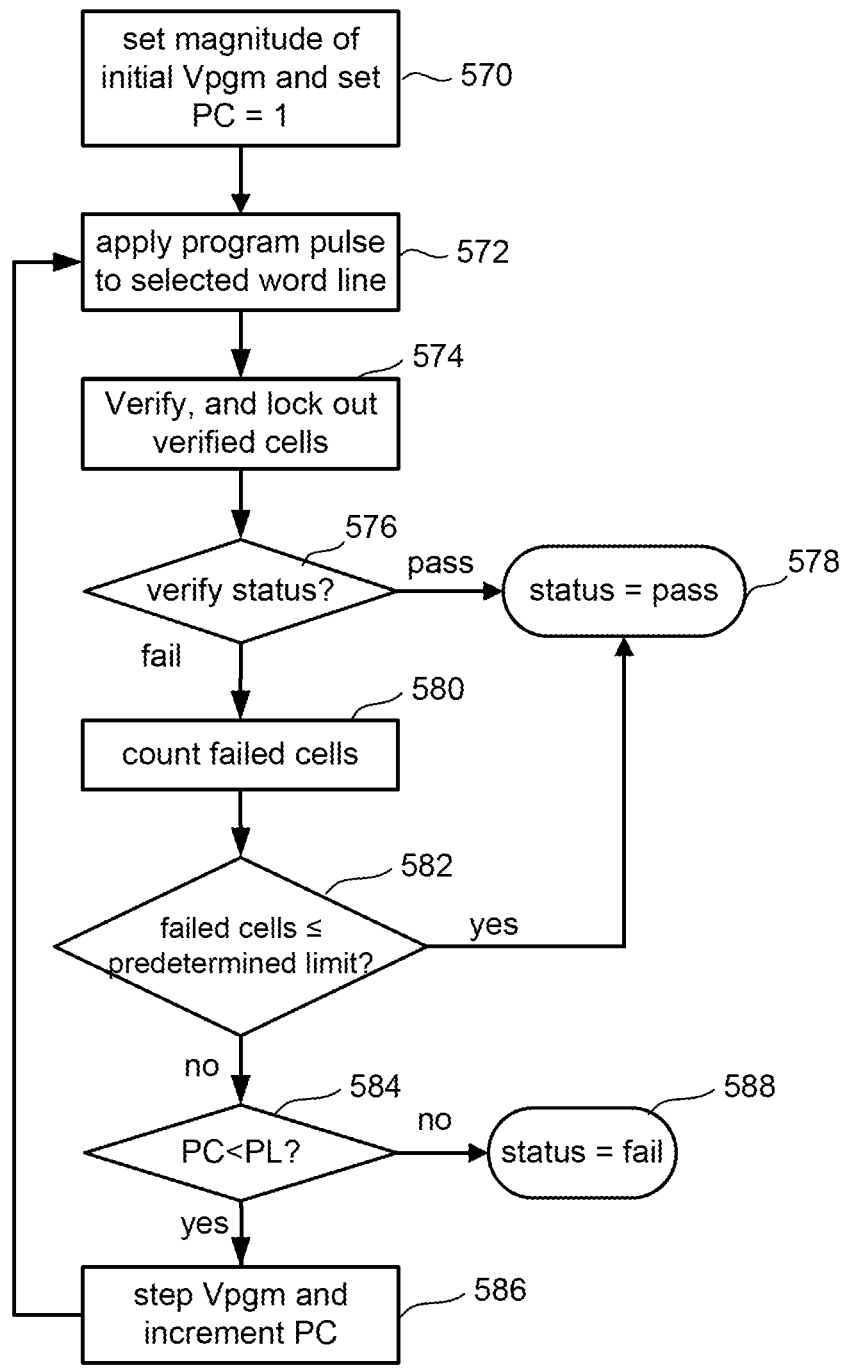
FIG. 11 is a flow chart describing one embodiment of a process for programming non-volatile memory.

FIG. 11 is a flow chart describing one embodiment of a process for performing programming on memory cells connected to a common word line to one or more targets (e.g., data states or threshold voltage ranges). The process of FIG. 11 can be performed one or multiple times during step 556 of FIG. 10. For example, the process of FIG. 11 can be used to program memory cells (e.g., full sequence programming) from state S0 directly to any of states S1-S7. Alternatively, the process of FIG. 11 can be used to perform one or each of the phases of the process of FIGS. 7A-E. For example, when performing the process of FIG. 7A, the process of FIG. 11 is used to implement the first phase that includes programming some of the memory cells from state E to state IM. The process of FIG. 11 can then be used again to implement the second phase that includes programming some of the memory cells from state E to states S1-S3 and from state IM to states S4-S7. The process of FIG. 11 can be used again to adjust states S1-S7 in the third phase (see FIG. 7D). The process of FIG. 11 can also be used with other multi-phase programming processes.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 570 of FIG. 11, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed are all connected to the same word line (the selected word line). The unselected word lines receive one or more boosting voltages (e.g., ~9 volts) to perform boosting schemes known in the art. If a memory cell should be programmed, then the corresponding bit line is grounded. On the other hand, if the memory cell should remain at its current threshold voltage, then the corresponding bit line is connected to VDD to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target levels to perform one or more verify operations. Step 574 of FIG. 11 includes performing a verification process for memory cells being programmed and locking out appropriate memory cells from further programming. There are various methods known in the art for verifying memory cells during programming many of which are suitable.

In step 576, it is determined whether all the memory cells have reached their target threshold voltages. If so, the programming process is complete and successful because all selected memory cells were programmed and verified to their target states. A status of "PASS" is reported in step 578. If, in 576, it is determined that not all of the memory cells have reached their target threshold voltages, then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in U.S. Pat. No. 7,545,681, incorporated herein by reference in its entirety. In another alternative, each of the sense amplifiers can output an analog voltage or current if its corresponding memory cell has failed and an analog voltage or current summing circuit can be used to count the number of memory cells that have failed.

In one embodiment, there is one total counted, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If the number of failed cells is not less than the predetermined limit, than the programming process continues at step 584 and the program counter PC is checked against the program limit value (PL). One example of a program limit value is 20; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

The steps shown in and described above with reference to FIG. 11 are exemplary steps of a method for programming non-volatile storage elements that includes performing a plurality of program-verify iterations. For example, in an embodiment, one iteration includes steps 572, 574, 576, 580, 582, 584 and 586 of FIG. 11, but are not limited thereto. During each of the program-verify iterations, programming pulses and verify pulses, examples of which were described above with reference to FIG. 6B, are selectively used to program and verify individual non-volatile storage elements that are coupled to a common word line.

One known way to speed up the programming of the non-volatile storage elements is to selectively skip performing the verify process (which involves applying one or more verify pulses) on non-volatile storage elements that probabilistically are below their verify target levels. For example, if a target data state for a non-volatile storage element is one of the higher data states (e.g., one of data states S5, S6 or S7, described above with reference to FIGS. 6A and 7A-7E), then a verify process may be skipped during early program-verify iterations, since it is unlikely that the non-volatile storage element will reach its target data state (and more specifically, its verify target level) after only a few programming pulses have been applied to the non-volatile storage element. For example, if it takes about 30 program-verify iterations to program and verify non-volatile storage elements coupled to a selected word line, then the verify process for non-volatile storage elements having target data states S5, S6 and S7 may, respectively, be skipped until the 12$^{th}$, 15$^{th}$ and 18$^{th}$ iterations. Exemplary additional details of such intelligent verification schemes and patent documents that describe the same were discussed above with reference to FIG. 6A. The following patents, which were previously mentioned in the above discussion of FIG. 6A, disclose exemplary intelligent verification schemes: U.S. Pat. No. 7,073,103 and U.S. Pat. No. 7,688,638. Some additional details of these patents are discussed immediately below.

U.S. Pat. No. 7,073,103 discloses how multi-state memories can be programmed using a "smart verify" technique with a verify-results-based dynamic adjustment of the multi-states verify range for sequential-state-based verify implementations. Such a "smart verify" technique can increase multi-state write speed while maintaining reliable operation within sequentially verified, multi-state memory implementations. It does so by providing "intelligent" means to minimize the number of sequential verify operations for each program/verify/lockout step of the write sequence. For example, by monitoring population movement to detect both the fastest programming cell, via data unconditional verification at the highest data state level covered in the verify scan range, as well as the all-cell-lockout condition for the lowest data state covered in that scan range (thereby encompassing the slowest programming cells), the scan's low and high ends of the threshold voltage scan window can be reliably established, with minimum time wastage from extra, unneeded verify operations. For a more specific example, in an embodiment of the write sequence for a multi-state memory during a program/verify sequence of the selected storage elements, at the beginning of the process only the lowest state of the multi-state range to which the selected storage elements are being programmed is checked during the verify phase. Once the first storage state is reached by one or more of the selected elements, the next state in the sequence of multi-states is added to the verify process. This next state can either be added immediately upon the fastest cells reaching this preceding state in the sequence or, since memories are generally designed to have several programming steps to move from state to state, after a delay of several cycles. The amount of delay can either be fixed or, preferably, use a parameter based implementation, allowing the amount of delay to be set according to device characteristics. The adding of states to the set being checked in the verify phase continues as per above through the rest of the multi-states in sequence until the highest state has been added. Similarly, lower states can be removed from the verify set as all of the selected storage elements bound for these levels verify successfully to those target values and are locked out from further programming. Additionally, previously identified defective cells that are unable to program properly can also be mapped out (e.g. by locking them out initially) eliminating their impact on the program/intelligent verify operation.

U.S. Pat. No. 7,688,638 also discloses techniques for increasing programming speed in non-volatile storage by reducing the number of verify operations. In one embodiment described in the '638 patent, a set of programming pulses is applied to a set of non-volatile storage elements, including a first group of non-volatile storage elements which are intended to be programmed to a first state, and a second group of non-volatile storage elements which are intended to be programmed to a second state. A number of verify operations n1 are performed for one subset of programming pulses of the set to determine whether the non-volatile storage elements in the first group have reached the first state, and a number of verify operations n2 are performed for the one subset to determine whether the nonvolatile storage elements in the second group have reached the second state, where n1>n2. The n2 verify operations include a verify operation between an initial programming pulse in the one subset and an immediately subsequent programming pulse. The '638 patent also teaches that for at least one portion of the programming pulses, verify operations are performed with a first frequency for non-volatile storage elements which are intended to be programmed to the at least one lower state, and verify operations are performed with a second, lower frequency, for non-volatile storage elements which are intended to be programmed to the highest state.

Conventionally, during a program-verify iteration that skips performing the verify process on a particular non-volatile storage element (e.g., because the target data state for the non-volatile storage element is one of the higher data states), programming of that particular non-volatile storage element is enabled during early program-verify iterations. This can involve, e.g., applying a program enable voltage (e.g., 0 V) to the bit line coupled to the non-volatile storage element, which results in the threshold voltage of the non-volatile storage element increasing in response one or more programming pulses being applied to the word line coupled to the non-volatile storage element (and thus, to the control terminal of the non-volatile storage element).

Continuing with the discussion of an exemplary non-volatile storage element having a target data state that is one of the higher data states, during early program-verify iterations, increases to the threshold voltage of the non-volatile storage element in response to application of programming pulses have little effect on the final threshold voltage for the non-volatile storage element. Accordingly, there may be little or no benefit to maintaining the channel voltage of a non-voltage storage element at 0V during early program-verify iterations that do not help the non-volatile storage element to be programmed faster. Rather, maintaining the channel voltage of a non-voltage storage element at 0V during early program-verify iterations (where the target data state is one of the higher data states) may actually have an adverse effect on neighboring non-voltage storage elements coupled to the same word line. For example, assume that a neighboring non-voltage storage element has reached a target data state that is one of the lower data states (e.g., S0, S1 or S3, but not limited thereto), and thus, an inhibit voltage (e.g., VDD) is applied to the bit line coupled to the neighboring non-voltage storage element. If 0V is applied to the bit line coupled to the non-voltage storage element (having one of the higher target data states), then there will be a relatively high voltage potential difference (e.g., ~VDD) between the non-voltage storage element (having one of the higher target data states) and its neighboring program inhibited non-voltage storage element (which has already been programmed to its target data state). This may detrimentally cause the neighboring program inhibited non-voltage storage element (which has already been programmed to its target data state) to experience a program disturb, in which its threshold voltage is raised to a next higher data state, or to a level at which the storage element cannot be accurately read.

Figure 12A:
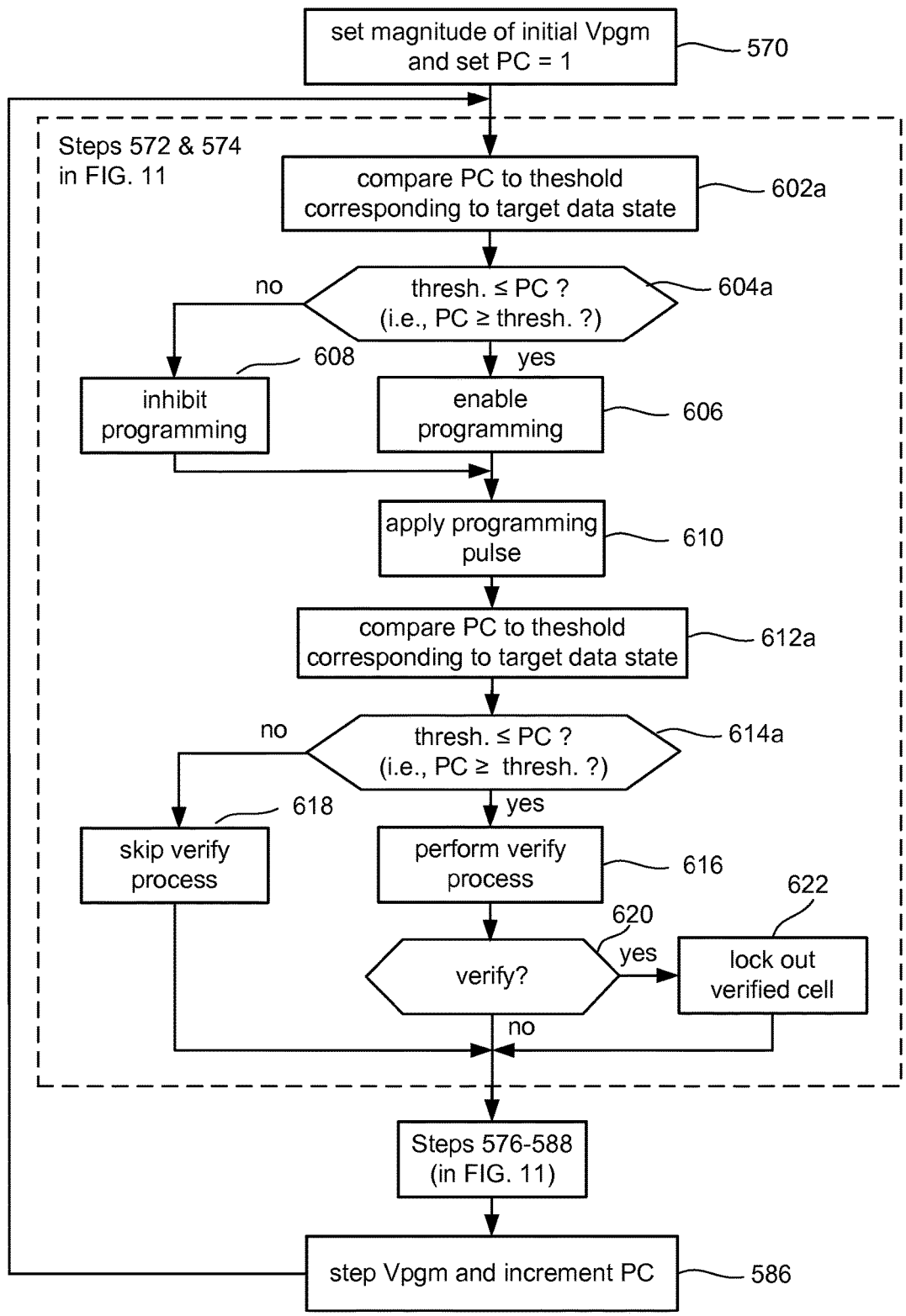
FIG. 12A is a flow that describes additional details of some of the steps introduced in FIG. 11 according to an embodiment.
Figure 12B:
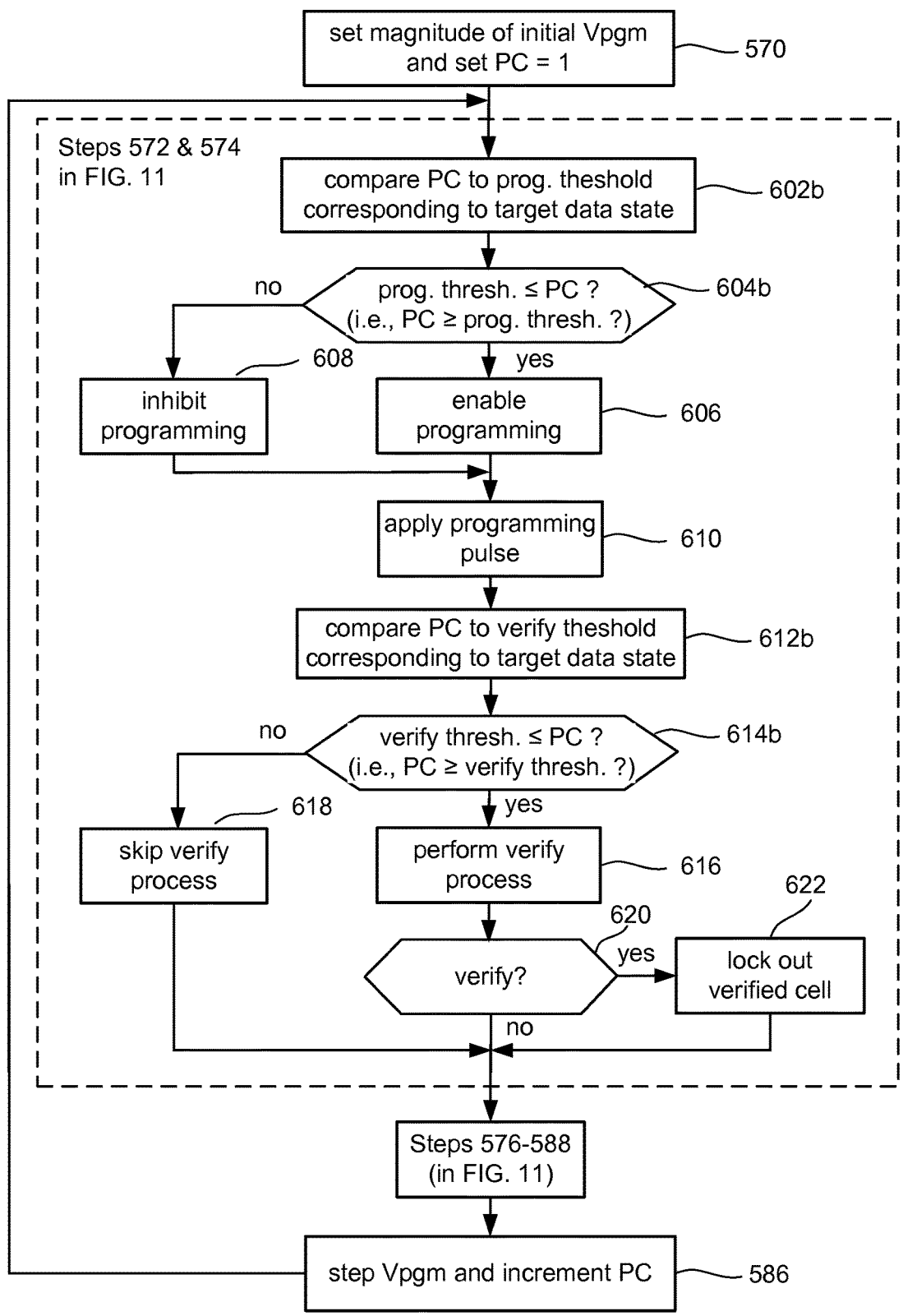
FIG. 12B is a flow that describes additional details of some of the steps introduced in FIG. 11 according to another embodiment.

Certain embodiments, described below, avoid this potential detriment by inhibiting programming of non-volatile storage elements having one of the higher target data states during early program-verify iterations of a programming process. More generally, in accordance with certain embodiments, a non-volatile storage element is inhibited from programming when a present program-verify iteration is less than a threshold that corresponds to a target data state that the non-volatile storage element is being programmed to. Such a threshold, as will be explained in more detail below, can be a loop number threshold, where a loop number (which can be the same as the program count (PC) referred to in the discussion of FIG. 11) is incremented with each program-verify iteration. Beneficially, inhibiting programming of the non-volatile storage element causes the channel voltage of the non-volatile storage element to be boosted, which speeds up programming of one or more further non-volatile storage elements neighboring the non-volatile storage element, compared to if the channel voltage of the non-volatile storage element is not boosted. Also beneficially, boosting of the channel voltage of the non-volatile storage element reduces the probability of a program disturb being experienced by one or more neighboring non-volatile storage elements coupled to the same word line. The flow charts of FIGS. 12A and 12b, described below, are used to explain such embodiments. More specifically, FIGS. 12A and 12b are used to describe additional details of steps 572 and 574 shown in FIG. 11, in accordance with two embodiments. Even more specifically, the steps shown within the dashed blocks in FIGS. 12A and 12b (which provide additional details of steps 572 and 574 shown in FIG. 11) are performed for each of a plurality of memory cells (also referred to as non-volatile storage elements) that are coupled to a selected word line during a programming process. For example, the steps described with reference FIGS. 12A and 12B can be performed substantially simultaneously for thousands of memory cells coupled to a common selected word line, where each memory cell is on a different NAND string.

Referring now to FIG. 12A, in step 570, the programming voltage (Vpgm) is initialized to the starting magnitude and a program counter PC (which can also be referred to as a loop value) is initialized at 1. Exemplary additional details of step 570 were described above in the discussion of FIG. 11.

In step 602a, the program counter PC is compared to a threshold that corresponds to a target data state to which a memory cell is being programmed. Assuming for example that there are seven possible target data states for a three bit memory cell, each target data stay may have its own unique threshold, or multiple target data states may share a common threshold. For example, each of target data states S1, S2, S3, S4, S5, S6 and S7 can have its own unique threshold. For another example, lower target data states S0, S1, S2, S3, S4 can all share a common threshold (e.g., 1 program-verify iteration), and higher target data states S4, S6 and S7 can each have their own unique threshold (e.g., 12, 15 and 18 program-verify iterations, respectively).

In step 604a, there is a determination of whether the threshold (that corresponds to the target data state that the memory cell is being programmed to) is less than or equal to the PC value, which is indicative of a present program-very iteration. Explained another way, at step 604a there is a determination of whether the PC value is greater than or equal to the threshold (that corresponds to the target data state that the memory cell is being programmed to). If the threshold is less than or equal to the PC value (i.e., the PC value is greater than or equal to the threshold), then programming of the memory cell is enabled for programming in step 606. If the threshold is not less than or equal to the PC value (i.e., the PC value is not greater than or equal to the threshold), then programming of the memory cell is inhibited from programming in step 608. Programming of the memory cell can be enabled in step 606 by applying an enable voltage (e.g., 0V, but not limited thereto) to a bit line coupled to the NAND string that includes the targeted/selected memory cell. Programming of the memory cell can be inhibited in step 608 by applying an inhibit voltage (e.g., VDD, but not limited thereto) to the bit line coupled to the NAND string that includes the targeted/selected memory cell. When a memory cell is described herein as being coupled to a bit line, that does not necessarily mean that the memory cell must be directly coupled to the bit line. Rather, the memory cell can be indirectly coupled to the bit line via the NAND string that includes the memory cell. Thereafter, in step 610, a programming pulse is applied to the selected word line, which is coupled to the memory cell.

In step 612a, there is again a determination of whether the threshold (that corresponds to the target data state that the memory cell is being programmed to) is less than or equal to the PC value, which is indicative of a present program-verify iteration. If the same threshold is used at step 612a as is used at step 602a (as is the case in the flow chart of FIG. 12A), then step 612a can be eliminated since it is repetitive.

In step 614a, there is a determination of whether the threshold (that corresponds to the target data state that the memory cell is being programmed to) is less than or equal to the PC value, which is indicative of a present program-verify iteration. Explained another way, at step 614a there is a determination of whether the PC value is greater than or equal to the threshold (that corresponds to the target data state that the memory cell is being programmed to). If the threshold is less than or equal to the PC value (i.e., the PC value is greater than or equal to the threshold), then the verify process is performed as indicated in step 616. If the threshold is not less than or equal to the PC value (i.e., the PC value is not greater than or equal to the threshold), then the verify process is skipped, as indicated in step 618. As explained above, the verify process is performed in order to determine whether the memory cell has reached its target threshold voltage range, or more generally, its target data state. As was explained above, a verify process can be performed by applying one or more verify pulses to a word line to which a memory cell is coupled to determine whether the threshold voltage of the memory cell has reached a verify target level. For example, as was discussed above in additional detail with reference to FIG. 6A, if the target data state for a memory cell is state S4, then the verify process performed during a program-verify iteration can include applying an appropriate verify pulse to the memory cell in order to determine whether the threshold voltage of the memory cell has reached the verify target level Vv4. By contrast, if a verify process is skipped, then a verify pulse (used to determine whether the threshold voltage of a memory cell has reached its verify target level) is not applied to the word line to which the memory cell is coupled.

In step 620, there is a determination of whether the memory cell was verified. If the memory cell was verified, then in step 622 the verified memory cell is locked out from further programming. As discussed above, one way to lock out a memory cell from further programming involves raising the bit line of the memory cell to an inhibit voltage (e.g., VDD). While not specifically shown in the flow chart, the results of the verification can be reported to a state machine or controller, as suited for the particular implementation.

After step 620, two or more of steps 576-588, described above with reference to FIG. 11, are performed. Referring briefly back to FIG. 11, this can involve in step 576, determining whether all the memory cells coupled to the selected word line have reached their target threshold voltages. If so, a status of "PASS" is reported in step 578. If, in step 576, it is determined that not all of the memory cells coupled to the selected word line have reached their target threshold voltages, then the programming process continues to step 580. In step 580, the system counts the number of memory cells that have not yet reached their respective target threshold voltage distribution. Additional details of this step were discussed above with reference to FIG. 11. In step 582, it is determined whether the count from step 580 is less than or equal to a predetermined limit. If the number of failed cells is less than or equal to the predetermined limit, than the programming process can stop and a status of "PASS" is reported in step 578. If the number of failed cells is not less than the predetermined limit, than the programming process continues at step 584 and the program counter PC is checked against the program limit value (PL). If the program counter PC is not less than the program limit value PL, then the program process is considered to have failed and a status of FAIL is reported in step 588. If the program counter PC is less than the program limit value PL, then the process continues at step 586.

Referring again to the flow chart of FIG. 12A, in step 586 the program counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 602a, and another program pulse is applied to the selected word line in the next iteration of step 610 while individual memory cells coupled to the selected word line are selectively enabled to be programmed or inhibited from being programmed in steps 606 and 608. In accordance with an embodiment, thresholds that correspond to target data states can be program count verify (PCV) values. For example, in such an embodiment, steps 602a, 604a, 612a and 614a can involve comparing a PC value to a PCV value (for a target data state) to determine whether the PC value is less than or equal to the PCV value.

In the embodiment described with reference to FIG. 12A, the same threshold that is used in steps 602a, 604a to determine whether or not to inhibit programming, is also used in steps 612a, 614a to determine whether or not to skip the verify process. In another embodiment, which is described below with reference to FIG. 12B, the threshold used to determine whether or not to inhibit programming can be different than the threshold used to determine whether or not to skip the verify process.

Referring to FIG. 12B, the flow chart shown therein is similar to the flow chart described above with reference to FIG. 12a, except that steps 602b, 604b, 612b and 614b in FIG. 12B replace the steps 602a, 604a, 612a and 614a in FIG. 12A. More generally, the difference between the embodiment described with reference to FIG. 12B and the embodiment described with reference to FIG. 12A is that in the embodiment of FIG. 12B, for one or more of the target data states, the threshold that is used in steps 602b, 604b to determine whether or not to inhibit programming, is different than the threshold used in steps 612b, 614b to determine whether or not to skip the verify process. To distinguish between these different types of thresholds, the threshold used at steps 602b and 604b is referred to as the program threshold, and the threshold used at steps 612b and 614b is referred to as the verify threshold. In an embodiment, each of the aforementioned thresholds can be program count (PC) value, which can also be referred to as a loop value or loop number.

Referring to FIG. 12B, in step 570, the programming voltage (Vpgm) is initialized to the starting magnitude and a program counter PC (which can also be referred to as a loop value) is initialized at 1. In step 602b, the program counter PC is compared to a program threshold that corresponds to a target data state to which a memory cell is being programmed. Assuming for example that there are seven possible target data states for a three bit memory cell, each target data stay may have its own unique program threshold, or multiple target data states may share a common program threshold. For example, each of target data states S1, S2, S3, S4, S5, S6 and S7 can have its own unique program threshold. For another example, lower target data states S0, S1, S2, S3, S4 can all share a common program threshold, and higher target data states S4, S6 and S7 can each have their own unique program threshold.

In step 604b, there is a determination of whether the program threshold (that corresponds to the target data state that the memory cell is being programmed to) is less than or equal to the PC value, which is indicative of a present program-very iteration. Explained another way, at step 604b there is a determination of whether the PC value is greater than or equal to the program threshold (that corresponds to the target data state that the memory cell is being programmed to). If the program threshold is less than or equal to the PC value (i.e., the PC value is greater than or equal to the program threshold), then programming of the memory cell is enabled for programming in step 606. If the program threshold is not less than or equal to the PC value (i.e., the PC value is not greater than or equal to the program threshold), then programming of the memory cell is inhibited from programming in step 608. As explained above, programming of the memory cell can be enabled in step 606 by applying an enable voltage (e.g., 0V, but not limited thereto) to a bit line coupled to the NAND string that includes the targeted/selected memory cell. Programming of the memory cell can be inhibited in step 608 by applying an inhibit voltage (e.g., VDD, but not limited thereto) to the bit line coupled to the NAND string that includes the targeted/selected memory cell. Thereafter, in step 610, a programming pulse is applied to the selected word line, which is coupled to the memory cell.

In step 612b, there is a determination of whether a verify threshold (that corresponds to the target data state that the memory cell is being programmed to) is less than or equal to the PC value, which is indicative of a present program-very iteration. In an embodiment, for at least some of the possible target date states, the verify threshold used at step 612b differs from the program threshold that is used at step 602a.

In step 614b, there is a determination of whether the verify threshold (that corresponds to the target data state that the memory cell is being programmed to) is less than or equal to the PC value, which is indicative of a present program-very iteration. Explained another way, at step 614b there is a determination of whether the PC value is greater than or equal to the verify threshold (that corresponds to the target data state that the memory cell is being programmed to). If the verify threshold is less than or equal to the PC value (i.e., the PC value is greater than or equal to the verify threshold), then the verify process is performed as indicated in step 616. If the verify threshold is not less than or equal to the PC value (i.e., the PC value is not greater than or equal to the verify threshold), then the verify process is skipped, as indicated in step 618. As explained above, the verify process is performed in order to determine whether the memory cell has reached its target threshold voltage range, or more generally, its target data state.

In step 620, there is a determination of whether the memory cell was verified. If the memory cell was verified, then in step 622 the verified memory cell is locked out from further programming. As discussed above, one way to lock out a memory cell from further programming involves raising the bit line of the memory cell to an inhibit voltage (e.g., VDD). While not specifically shown in the flow chart, the results of the verification can be reported to a state machine or controller, as suited for the particular implementation.

After step 620, two or more of steps 576-588, described above with reference to FIG. 11, are performed. Referring briefly back to FIG. 11, this can involve in step 576, determining whether all the memory cells coupled to the selected word line have reached their target threshold voltages. If so, a status of "PASS" is reported in step 578. If, in 576, it is determined that not all of the memory cells coupled to the selected word line have reached their target threshold voltages, then the programming process continues to step 580. In step 580, the system counts the number of memory cells that have not yet reached their respective target threshold voltage distribution. Additional details of this step were discussed above with reference to FIG. 11. In step 582, it is determined whether the count from step 580 is less than or equal to a predetermined limit. If the number of failed cells is less than or equal to the predetermined limit, than the programming process can stop and a status of "PASS" is reported in step 578. If the number of failed cells is not less than the predetermined limit, than the programming process continues at step 584 and the program counter PC is checked against the program limit value (PL). If the program counter PC is not less than the program limit value PL, then the program process is considered to have failed and a status of FAIL is reported in step 588. If the program counter PC is less than the program limit value PL, then the process continues at step 586.

In step 586 the program counter PC is incremented by 1 and the program voltage Vpgm is stepped up to the next magnitude. After step 586, the process loops back to step 602b, and another program pulse is applied to the selected word line in the next iteration of step 610 while individual memory cells coupled to the selected word line are selectively enabled to be programmed or inhibited from being programmed in steps 606 and 608.

In accordance with an embodiment, for each of the possible target data states, the corresponding program threshold and verify threshold differ from one another. Alternatively, the program threshold and the verify threshold for each of a subset of the possible target data states are the same, while for each of another subset of the target data states the corresponding program threshold and verify threshold differ from one another. For example, if there are eight possible data states (e.g., S0-S7) for three bit memory cells, then the program threshold and the verify threshold for each of the data states S0, S1 and S2 can be the same as one another, and the program threshold and the verify threshold for each of the data states S3, S4, S5, S6 and S7 can differ from one another. For a more specific example, the program threshold for the data state S5 can be 10, while the verify threshold for the same data state S5 is 13. More generally, the verify threshold that corresponds to the target data state that a non-volatile storage element is being programmed to is equal to or greater than the program threshold that corresponds to the target data state that the non-volatile storage element is being programmed to. This is because there is no reason to perform a verify process on a memory cell before that memory cell has already begun being programmed.

The program-verify iterations described with reference to FIGS. 12A and 12B can all be performed during a single phase programming process, such as the programming process described above with reference to FIG. 6A. Alternatively, the program-verify iterations described with reference to FIGS. 12A and 12B can be performed during a same one of either a second phase or a third phase of a multi-phase programming process that includes a first phase, followed by the second phase, followed by the third phase, such as the programming process described above with reference to FIG. 7A-7E. More specifically, referring back to FIGS. 7A-7E, the first phase of a multi-phase programming process was described with reference to FIGS. 7A and 7B, and second and third phases of the multi-phase programming process were described with reference to FIGS. 7C-7E.

Figure 13:
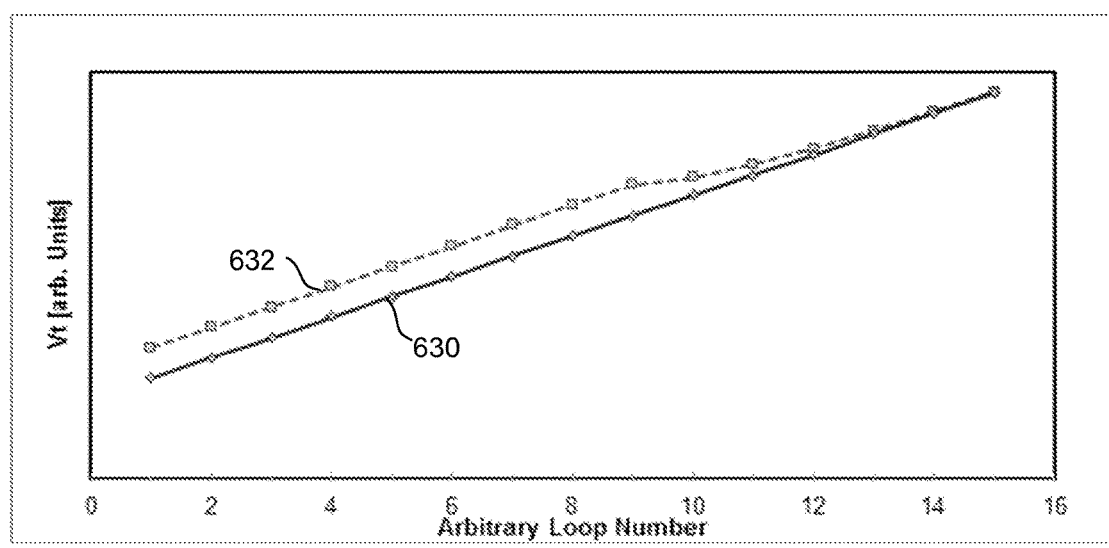
FIG. 13 is a plot that is used to illustrate how embodiments described herein can be used to speed up programming of neighboring memory cells.

The embodiments described above with reference to FIGS. 12A and 12B can be used to achieve improved memory cell reliability. The embodiments described above with reference to FIGS. 12A and 12B can also be used to achieve tighter threshold voltage (Vt) distributions. By boosting the channel voltage of a memory cell (by inhibiting programming of the memory cell) when a present program-verify iteration is less than a threshold that corresponds to a target data state the memory cell is being programmed to, one or more neighboring memory cells that is/are being programmed will program faster due to an increased channel to neighbor floating gate (FG) coupling. Thereafter, once the memory cell reaches the threshold that corresponds to the target data state that the memory cell is being programmed to, there will be a change to the channel voltage (from an inhibit voltage to a program enable voltage) that results in programming of the neighboring memory cell(s) slowing down until they reach a new steady state. If a neighboring memory cell finishes programming before reaching its new steady state, it is expected that the neighboring cell will have a smaller effective change in its voltage threshold ($\Delta Vt$) compared to the case when selected memory cells are always programming until they reach their target data states and are verified. This is illustrated in FIG. 13, where the plotted curve 630 illustrates changes in the median Vt of neighboring memory cells of a memory cell that is inhibited from being programmed until a threshold that corresponds to a target data state the memory cell is reached; and the plotted curve 632 illustrates changes in the median Vt of neighboring memory cells of a memory cell having its programming enabled until it reaches its target data state and is only then inhibited from being programmed. In FIG. 13, the vertical axis corresponds to median threshold voltage (Vt) in arbitrary units (arb. Units), and the horizontal axis corresponds to arbitrary loop numbers.

The embodiments described above with reference to FIGS. 12A and 12B can also reduce the number of program disturbs that may be experienced by neighboring memory cells that have already reached their target data state, as already explained above. Additionally, by reducing memory cells' exposure to high Vpass, the embodiments described above with reference to FIGS. 12A and 12B can also reduce the number of Vpass disturbs that may be experienced by neighboring memory cells that have already reached their target data state. Further, the embodiments described above with reference to FIGS. 12A and 12B may also save power by reducing the average bit line to bit line capacitance, wherein the greater the bit line to bit line capacitance, the greater the power consumption.

In an embodiment, the steps described with reference to FIGS. 12A and 12B can be performed under the control of a control circuit that includes one or more of the control circuitry 220, power control 226, decoder 224, state machine 222, decoders 240 A/B & 242A/B, the read/write circuits 230A/B and the controller 244, which were described above with reference to FIG. 3.

In accordance with an embodiment, a method for programming a non-volatile storage element includes performing a plurality of program-verify iterations for the non-volatile storage element. The method includes inhibiting programming of the non-volatile storage element when a present program-verify iteration is less than a threshold that corresponds to a target data state that the non-volatile storage element is being programmed to. The inhibiting programming of the non-volatile storage element causes a channel voltage of the non-volatile storage element to be boosted, which speeds up programming of one or more further non-volatile storage elements neighboring the non-volatile storage element, compared to if the channel voltage of the non-volatile storage element is not boosted. The method also includes enabling programming of the non-volatile storage element when the present program-verify iteration is greater than or equal to the threshold that corresponds to the target data state that the non-volatile storage element is being programmed to. In an embodiment, the aforementioned plurality of program-verify iterations are performed during a single phase programming process. In an alternative embodiment, the plurality of program-verify iterations are performed during a same one of either a second phase or a third phase of a multi-phase programming process that includes a first phase, followed by the second phase, followed by the third phase.

In accordance with an embodiment, a non-voltage storage system includes a non-volatile storage element and a control circuit in communication with the non-volatile storage element. The control circuit is configured to perform a plurality of program-verify iterations for the non-volatile storage element, during which the control circuit inhibits programming of the non-volatile storage element when a present program-verify iteration is less than a threshold that corresponds to a target data state that the non-volatile storage element is being programmed to, and enables programming of the non-volatile storage element when the present program-verify iteration is greater than or equal to the threshold that corresponds to the target data state that the non-volatile storage element is being programmed to. When the control circuit inhibits programming of the non-volatile storage element a channel voltage of the non-volatile storage element is boosted, which speeds up programming of one or more further non-volatile storage elements neighboring the non-volatile storage element, compared to if the channel voltage of the non-volatile storage element is not boosted. In an embodiment, the control circuit is configured to perform the plurality of program-verify iterations during a single phase programming process. Alternatively, the control circuit is configured to perform the plurality of program-verify iterations during a same one of either a second phase or a third phase of a multi-phase programming process that includes a first phase, followed by the second phase, followed by the third phase.

In accordance with an embodiment, a method for programming non-volatile storage includes performing a plurality of program-verify iterations for a plurality of non-volatile storage elements coupled to a selected word line, wherein a loop number is incremented with each program-verify iteration. The method also includes performing the following steps, during the program-verify iterations, for each of the non-volatile storage elements coupled to the selected word line. The loop number is compared to a threshold loop value that corresponds to a target data state to which the non-volatile storage element is to be programmed. The threshold loop value specifies a loop number at which a program enable voltage is to start being applied to a bit line coupled to the non-volatile storage element. At least a subset of a plurality of possible target data states has a corresponding threshold loop value. A program inhibit voltage is applied to a bit line coupled to the non-volatile storage element if the target data state to which the non-volatile storage element is to be programmed has a corresponding threshold loop value that is greater than the loop number. A program enable voltage is applied to the bit line coupled to the non-volatile storage element if the target data state to which the non-volatile storage element is to be programmed has a corresponding threshold loop value that is less than or equal to the loop number. A programming pulse is applied to the word line to which the non-volatile storage element is coupled. In an embodiment, the plurality of program-verify iterations are performed during a single phase programming process. Alternatively, the plurality of program-verify iterations are performed during a same one of either a second phase or a third phase of a multi-phase programming process that includes a first phase, followed by the second phase, followed by the third phase.

In accordance with an embodiment, a non-voltage storage system includes a plurality of non-volatile storage elements coupled to a common word line. A control circuit is in communication with the non-volatile storage elements coupled to the common word line. The control circuit is configured to perform a plurality of program-verify iterations for the plurality of non-volatile storage elements coupled to the word line when the word line is selected and increments a loop number with each program-verify iteration. More specifically, the control circuit, for each of the non-volatile storage elements coupled to the selected word line, during the program-verify iterations, does the following. The control circuit compares the loop number to a threshold loop value that corresponds to a target data state to which the non-volatile storage element is to be programmed, the threshold loop value specifying a loop number at which the control circuit is to start applying a program enable voltage to a bit line coupled to the non-volatile storage element. The control circuit applies a program inhibit voltage to a bit line coupled to the non-volatile storage element if the target data state to which the non-volatile storage element is to be programmed has a corresponding threshold loop value that is greater than the loop number. The control circuit applies a program enable voltage to the bit line coupled to the non-volatile storage element if the target data state to which the non-volatile storage element is to be programmed has a corresponding threshold loop value that is less than or equal to the loop number. Additionally, the control circuit applies a programming pulse to the word line to which the non-volatile storage element is coupled. More generally, the control circuit is configured to selectively inhibit or enable programming of the non-volatile storage element in dependence on a comparison between a program-verify iteration and a threshold that corresponds to a target data state that the non-volatile storage element is being programmed to.

The foregoing detailed description has been presented for purposes of illustration and description. It is not intended to be exhaustive or to limit the technology to the precise form disclosed. Many modifications and variations are possible in light of the above teaching. The described embodiments were chosen in order to best explain the principles and practical application, to thereby enable others skilled in the art to best utilize the technology in various embodiments and with various modifications as are suited to the particular use contemplated. It is intended that the scope of be defined by the claims appended hereto. Further, it is noted that in the foregoing description, the terms connected and coupled do not necessarily imply a direct connection or a direct coupling, but rather, also encompass indirect connections and couplings.

We claim:
1. A method, comprising:
performing a plurality of program-verify iterations for each of a plurality of non-volatile storage elements, wherein a loop number is incremented with each program-verify iteration, the performing including, for each non-volatile storage element, of the plurality of non-volatile storage elements
inhibiting programming of the non-volatile storage element when the loop number is less than a loop number threshold that corresponds to a target data state for the non-volatile storage element; and
enabling programming of the non-volatile storage element when the loop number is greater than or equal to the loop number threshold that corresponds to the target data state for the non-volatile storage element.
2. The method of claim 1, wherein the inhibiting programming of the non-volatile storage element causes a channel voltage of the non-volatile storage element to be boosted, which speeds up programming of one or more further non-volatile storage elements neighboring the non-volatile storage element, compared to if the channel voltage of the non-volatile storage element is not boosted.
3. The method of claim 1, wherein the plurality of program-verify iterations are performed during a single phase programming process.
4. The method of claim 1, wherein the plurality of program-verify iterations are performed during a same one of either a second phase or a third phase of a multi-phase programming process that includes a first phase, followed by the second phase, followed by the third phase.
5. The method of claim 1, further comprising:
skipping performing a verify process on the non-volatile storage element when the loop number is less than the loop number threshold that corresponds to the target data state for the non-volatile storage element; and
performing the verify process on the non-volatile storage element when the loop number is greater than or equal to the loop number threshold that corresponds to the target data state for the non-volatile storage element.
6. The method of claim 1, further comprising:
skipping performing a verify process on the non-volatile storage element when the loop number is less than a verify threshold that corresponds to the target data state for the non-volatile storage element; and
performing the verify process on the non-volatile storage element when the loop number is greater than or equal to the verify threshold that corresponds to the target data state for the non-volatile storage element.
7. The method of claim 6, wherein the verify threshold that corresponds to the target data state for the non-volatile storage element is equal to or greater than the loop number threshold that corresponds to the target data state for the non-volatile storage element.

8. An apparatus, comprising:
a plurality of non-volatile storage elements; and
a control circuit in communication with the plurality of non-volatile storage elements and configured to perform a plurality of program-verify iterations for the plurality of non-volatile storage elements, and configured to increment a loop number with each program-verify iteration,
wherein for each non-volatile storage element, of the plurality of non-volatile storage elements, the control circuit is configured to selectively program the non-volatile storage element based on a comparison between the loop number and a loop number threshold that corresponds to a target data state for the non-volatile storage element.

9. The apparatus of claim 8, wherein the control circuit is configured to selectively inhibit programming of the non-volatile storage element, based on the comparison between the loop number and the loop number threshold that corresponds to the target data state for the non-volatile storage element, wherein a channel voltage of the non-volatile storage element is boosted when the control circuit inhibits programming of the non-volatile store element, which speeds up programming of one or more further non-volatile storage elements neighboring the non-volatile storage element.

10. The apparatus of claim 8, wherein the control circuit is configured to perform a plurality of program-verify iterations during a single phase programming process, or during a same one of either a second phase or a third phase of a multi-phase programming process that includes a first phase, followed by the second phase, followed by the third phase.

11. The apparatus of claim 8, wherein during a plurality of program-verify iterations for the non-volatile storage element, the control circuit is configured to skip performing a verify process on the non-volatile storage element when the loop number is less than the loop number threshold that corresponds to the target data state for the non-volatile storage element, and perform the verify process on the non-volatile storage element when the loop number is greater than or equal to the loop number threshold that corresponds to the target data state for the non-volatile storage element.

12. The apparatus of claim 11, wherein during the plurality of program-verify iterations for the non-volatile storage element the control circuit is configured to skip performing a verify process on the non-volatile storage element when the loop number is less than a verify threshold that corresponds to the target data state for the non-volatile storage element, and perform the verify process on the non-volatile storage element when the loop number is greater than or equal to the verify threshold that corresponds to the target data state for the non-volatile storage element.

13. The apparatus of claim 11, wherein the verify threshold that corresponds to the target data state for the non-volatile storage element is equal to or greater than the loop number threshold that corresponds to the target data state for the non-volatile storage element.

14. A method comprising:
(a) performing a plurality of program-verify iterations for a plurality of non-volatile storage elements coupled to a selected word line, wherein a loop number is incremented with each program-verify iteration;
(b) during the program-verify iterations, for each of the non-volatile storage elements coupled to the selected word line,
(b.1) comparing the loop number to a threshold loop value that corresponds to a target data state for the non-volatile storage element,
wherein the threshold loop value specifies the loop number at which a program enable voltage is applied to a bit line coupled to the non-volatile storage element, and
wherein at least a subset of a plurality of possible target data states has a respective threshold loop value that corresponds to the target data state for the non-volatile storage element;
(b.2) applying a program inhibit voltage to the bit line coupled to the non-volatile storage element if the threshold loop value that corresponds to the target data state for the non-volatile storage element is greater than the loop number;
(b.3) applying a program enable voltage to the bit line coupled to the non-volatile storage element if the threshold loop value that corresponds to the target data state for the non-volatile storage element is less than or equal to the loop number; and
(b.4) applying a programming pulse to the selected word line to which the non-volatile storage element is coupled.

15. The method of claim 14, wherein the plurality of program-verify iterations are performed during a single phase programming process.

16. The method of claim 14, wherein the plurality of program-verify iterations are performed during a same one of either a second phase or a third phase of a multi-phase programming process that includes a first phase, followed by the second phase, followed by the third phase.

17. The method of claim 14, wherein:
a same threshold loop value that corresponds to each of the plurality of possible target data states also specifies the loop number at which a verify process is to begin being performed on the non-volatile storage element.

18. The method of claim 17, wherein step (b) further comprises:
(b.5) skipping performing the verify process on the non-volatile storage element if the target data state for the non-volatile storage element has a corresponding threshold loop value that is greater than the loop number; and
(b.6) performing the verify process on the non-volatile storage element if the target data state for the non-volatile storage element has a corresponding threshold loop value that is less than or equal to the loop number.

19. The method of claim 14, wherein:
the threshold loop value in (b.2), (b.3) and (b.4) is a program threshold loop value;
at least a subset of the plurality of possible target data states has a corresponding verify threshold loop value that specifies a loop number at which a verify process is to start being performed on a non-volatile storage element; and
the corresponding program threshold loop value is different than the corresponding verify threshold loop value for one or more of the possible target data states.

20. The method of claim 19, wherein step (b) further comprises:
(b.5) comparing the loop number to the corresponding verify threshold loop value that corresponds to the target data state for the non-volatile storage element;
(b.6) skipping performing the verify process on the non-volatile storage element if the target data state for the non-volatile storage element has a corresponding verify threshold loop value that is greater than the loop number; and (b.7) performing the verify process on the non-volatile storage element if the target data state for the non-volatile storage element has a corresponding verify threshold loop value that is less than or equal to the loop number.

21. The method of claim 20, wherein for each of the plurality of possible target data states the corresponding verify threshold loop value is greater than or equal to the corresponding program threshold loop value.

22. The method of claim 14, wherein:
the plurality of possible target data states comprise eight different states, which include five lower target data states and three upper target data states;
the threshold loop values for the five lower target data states are equal to zero; and
the threshold loop values for the three upper target data states are greater than zero.

23. A non-voltage storage system, comprising:
a plurality of non-volatile storage elements coupled to a common word line; and
a control circuit in communication with the non-volatile storage elements coupled to the common word line, the control circuit configured to perform a plurality of program-verify iterations for the plurality of non-volatile storage elements coupled to the common word line when the common word line is selected and configured to increment a loop number with each program-verify iteration;
the control circuit, for each of the non-volatile storage elements coupled to the selected word line, during the program-verify iterations, configured to apply a program inhibit voltage to a bit line coupled to the non-volatile storage element if a target data state for the non-volatile storage element has a corresponding threshold loop value that is greater than the loop number, apply a program enable voltage to the bit line coupled to the non-volatile storage element if the target data state for the non-volatile storage element has a corresponding threshold loop value that is less than or equal to the loop number, and apply a programming pulse to the common word line to which the non-volatile storage element is coupled.

* * * * *